United States Patent
Sukigara et al.

[11] Patent Number: 6,017,402
[45] Date of Patent: Jan. 25, 2000

[54] COMPOSITE MAGNETOSTRICTIVE MATERIAL, AND PROCESS FOR PRODUCING THE SAME

[75] Inventors: Tohru Sukigara; Teruyoshi Kita; Jun Takizawa, all of Saitama, Japan

[73] Assignee: Honda Giken Kogyo Kabushiki Kaisha, Tokyo, Japan

[21] Appl. No.: 08/919,721

[22] Filed: Aug. 28, 1997

[30] Foreign Application Priority Data

Aug. 30, 1996 [JP] Japan .................... 8-249188

[51] Int. Cl.⁷ .................................... H01F 1/055
[52] U.S. Cl. ............................. 148/301; 148/303
[58] Field of Search ...................... 148/301, 303

[56] References Cited

U.S. PATENT DOCUMENTS

| | | | |
|---|---|---|---|
| 4,116,726 | 9/1978 | Menth | 148/303 |
| 4,279,668 | 7/1981 | Kurz et al. | 148/101 |
| 4,322,257 | 3/1982 | Menth et al. | 148/101 |
| 4,484,957 | 11/1984 | Higuachi et al. | 148/303 |
| 4,971,637 | 11/1990 | Ohashi et al. | 148/301 |
| 5,338,331 | 8/1994 | Hijikatas et al. | 75/246 |
| 5,549,766 | 8/1996 | Tsutai et al. | 148/301 |

*Primary Examiner*—John Sheehan
*Attorney, Agent, or Firm*—Lyon & Lyon LLP

[57] ABSTRACT

A composite magnetostrictive material having a magnetostrictive performance required for a practical use and yet a higher strength. A composite magnetostrictive material 1 is comprised of a matrix 2 formed of a magnetostrictive material of an RM-based alloy, wherein R is a rare earth element and M is one of a transition metal and aluminum, and dispersion phases 3 dispersed in the matrix and formed of at least one of an RM-based metal, R and M.

12 Claims, 9 Drawing Sheets

Phase (2) of Sm2Fe17
Phase (3) of Sm7Cu3
Phase (2) of SmFe2

COMPOSITE MAGNETOSTRICTIVE MATERIAL, AND PROCESS FOR PRODUCING THE SAME

FIELD OF THE INVENTION

The present invention relates to a composite magnetostrictive material, and a process for producing the same.

BACKGROUND OF THE INVENTION

There is a conventionally known magnetostrictive material formed of an SmFe-based alloy. This magnetostrictive material has an excellent magnetostrictive performance, but suffers from a problem that it has a low physical strength.

SUMMARY OF THE INVENTION

It is an object of the present invention to provide a composite magnetostrictive material having a magnetostrictive performance required for practical use, and a higher physical strength.

To achieve the above object, according to the present invention, there is provided a composite magnetostrictive material comprising a matrix formed of a magnetostrictive material made of an RM-based alloy (wherein R is a rare earth element and M is selected from the group consisting of transition metals and aluminum), and dispersion phases dispersed in the matrix with each dispersion phase formed of at least one of an RM-based metal, R and M.

With the above feature of the present invention, the dispersion phase exhibits a composite reinforcing capability and hence, an enhancement in strength of the composite magnetostrictive material is achieved. In this case, as the amount of the dispersion phases is increased, the magnetostrictive performance of the composite magnetostrictive material is lowered. However, the magnetostrictive performance can be maintained at a level for a practical use by adjusting the amount of the dispersion phases.

It is another object of the present invention to provide a producing process which is capable of easily mass-producing a composite magnetostrictive material of the above-described type.

To achieve the above object, according to the present invention, there is provided a process for producing a composite magnetostrictive material, comprising the steps of bringing a diffusing material comprising at least one of an RM-based alloy, R and M into contact with a magnetostrictive material formed of an RM-based alloy (wherein R is a rare earth element, and M is selected from the group consisting of transition metals and aluminum), and subjecting the diffusing material and the magnetostrictive material to a thermal treatment to produce a liquid phase diffusion.

With the above process, a composite magnetostrictive material can be easily mass-produced. In this case, it is possible to enhance the diffusion of liquid phases and the magnetostrictive performance of the magnetostrictive material simultaneously by adjusting the heating temperature and time.

DETAILED DESCRIPTION OF THE PREFERRED EMBODIMENTS OF THE INVENTION

Figure 1:
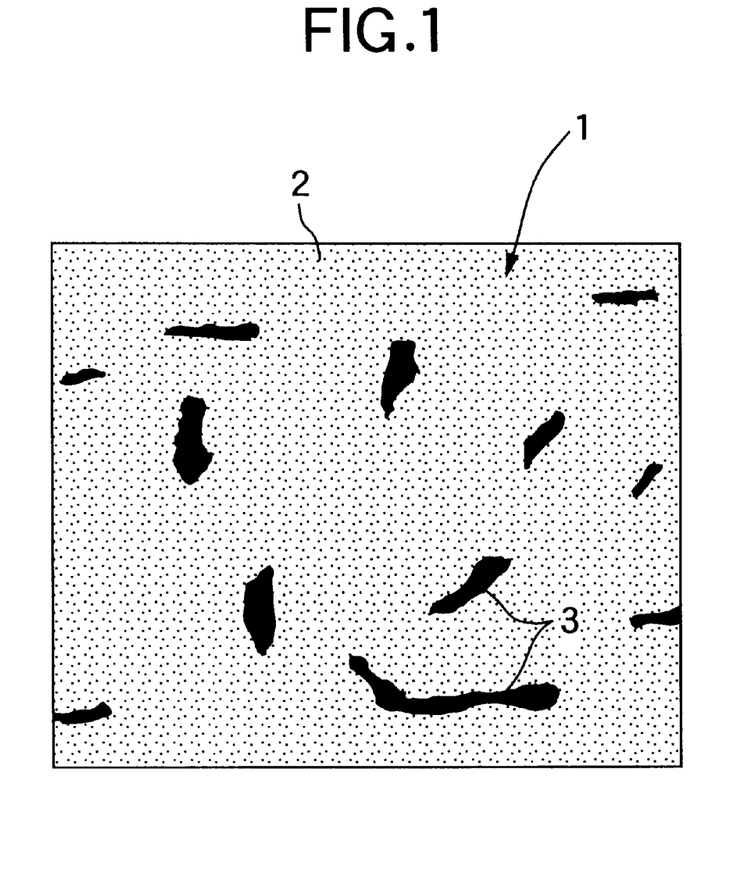
FIG. 1 is an illustration of the metallographic structure of a composite magnetostrictive material according to an embodiment of the invention.

FIG. 1 illustrates the metallographic structure of a composite magnetostrictive material 1. The metallographic structure is comprised of a matrix 2 formed of a magnetostrictive material of an RM-based alloy (wherein R is a rare earth element, and M is selected from the group consisting of transition metals and aluminum), and dispersion phases 3 dispersed in the matrix 2 which dispersion phases 3 are formed of at least one of an RM alloy, R and M.

The rare earth element R that may be used is any one of the 17 rare earth elements such as Sm, Tb, Dy and the like. A suitable transition metal M is any of the metal elements having atomic numbers from 22 to 30, i.e. from Ti to Zn.

If the composite magnetostrictive material 1 is formed in the above manner, the dispersion phase 3 exhibits a composite reinforcing capability and hence, an enhancement in the physical strength of the composite magnetostrictive material 1 is achieved.

Figure 2:
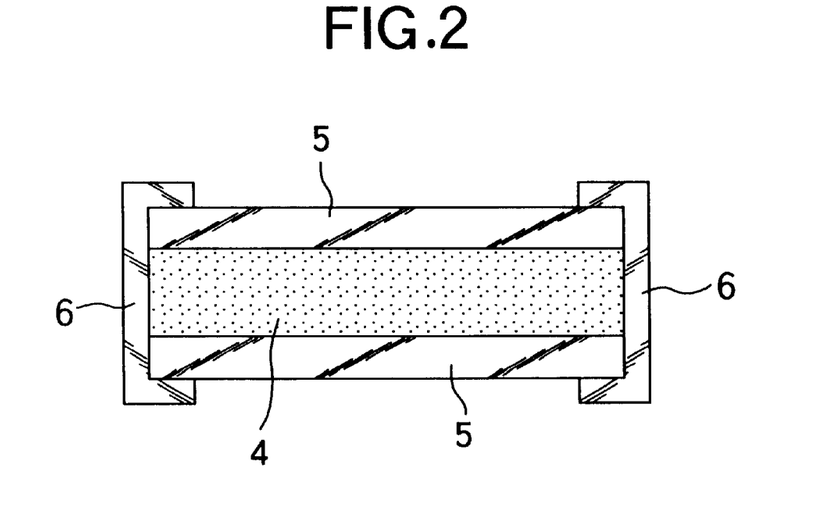
FIG. 2 is a side view showing the relation between a magnetostrictive material and diffusing materials.

In producing the composite magnetostrictive material 1, as shown in FIG. 2, plate-like diffusing materials 5 each formed of at least one of an RM-based alloy, R and M are brought into contact with opposite sides of a plate-like magnetostrictive material 4 which is a cast product and formed of an RM-based alloy. The plate-like magnetostrictive material 4 and the plate-like diffusing materials 5 are clamped by a pair of clamping members 6 and then subjected to a thermal treatment, whereby they are partially molten to produce the diffusion of liquid phases.

The thermal treating temperature T is a temperature at which a partial melting is produced. This temperature is determined from state diagrams of the magnetostrictive material 4 and the plate-like diffusing material 5 and is in a range of about 500° C.≦T≦about 900° C., depending on the materials. The thermal treating time t is determined from a liquid phases diffusion coefficient of the diffusing material 5 and is in a range of about 0.5 hr≦t≦about 9 hr., depending on the diffusing material. Further, it is desirable that the thermal treatment be carried out in an inert gas atmosphere or in a vacuum for preventing the degradation of the magnetostrictive material 4.

In this case, it is possible to enhance the magnetostrictive performance of the magnetostrictive material 4 and thus of the matrix 2 simultaneously with the diffusion of the liquid phases by adjusting the heating temperature and time.

EXAMPLES A

Using a high-frequency melting furnace, a molten metal having a composition of an SmFe$_{1.7}$ alloy (the unit of a numeral value is the number of moles of the atom) was prepared under a reduced pressure (600 Torr) in an atmosphere of argon and poured into a casting mold of copper at a casting temperature of 1,200° C., thereby producing a magnetostrictive material 4 in a casting manner.

Figure 3:
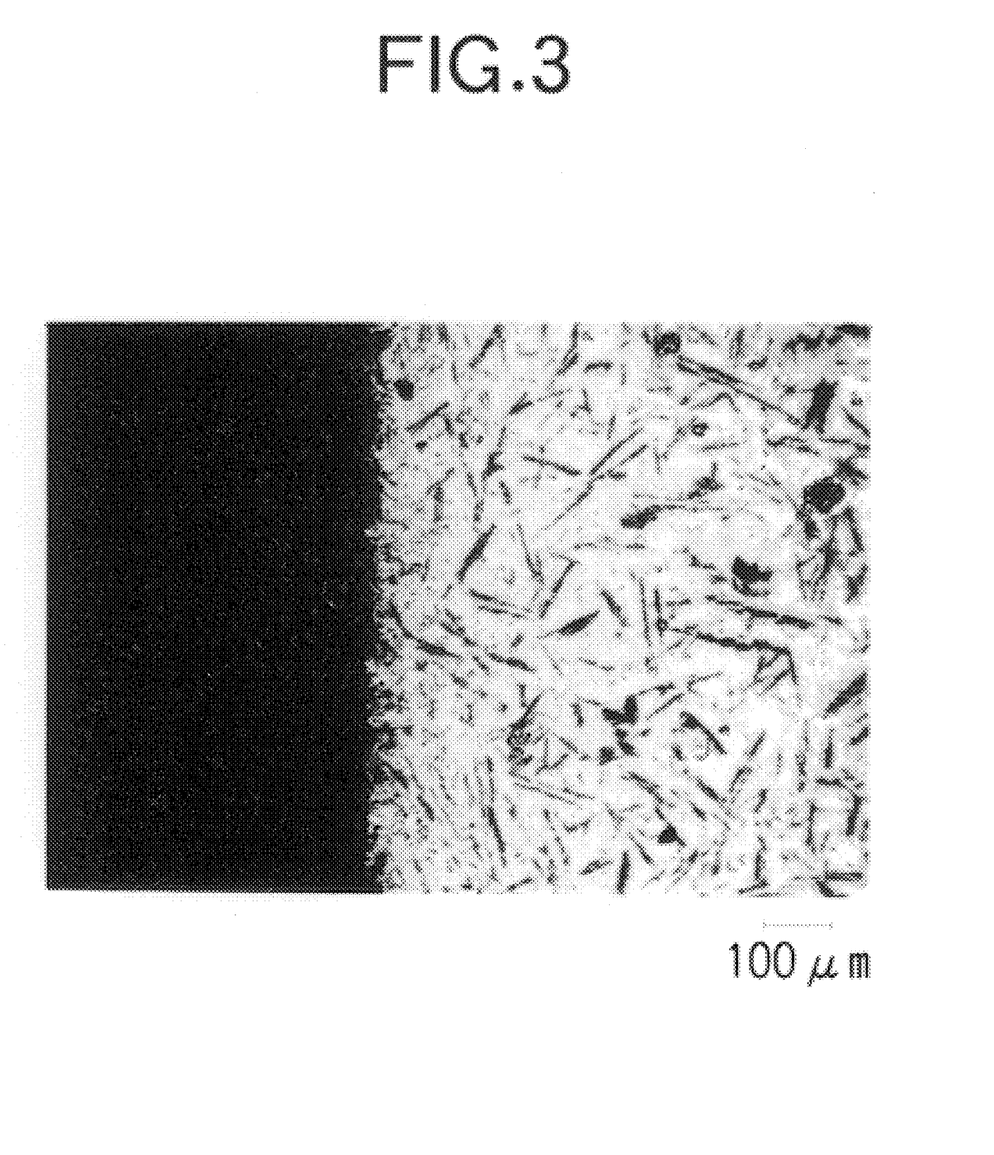
FIG. 3 is a photomicrograph showing the metallographic structure of a magnetostrictive material.

FIG. 3 is a photomicrograph showing the metallographic structure of the magnetostrictive material 4. In FIG. 3, a gray phase of SmFe$_2$, a black phase of SmFe$_3$ and a white phase of Sm are observed.

As shown in FIG. 2, plate-like diffusing materials 5 made of an Fe-Ni alloy were brought into contact with opposite sides of the plate-like magnetostrictive material 4, respectively. The plate-like diffusing materials 5 and the plate-like magnetostrictive material 4 were clamped by a pair of clamping members 6 made of iron and then subjected to a thermal treatment in a vacuum at 800° C. for 6 hours to produce a composite magnetostrictive material 1, while at the same time, enhancing the magnetostrictive performance of the magnetostrictive material 4.

Figure 4A:
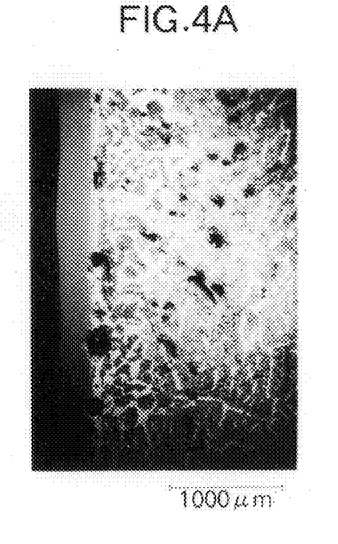
FIG. 4A is a photomicrograph showing the metallographic structure of a composite magnetostrictive material.
Figure 4B:
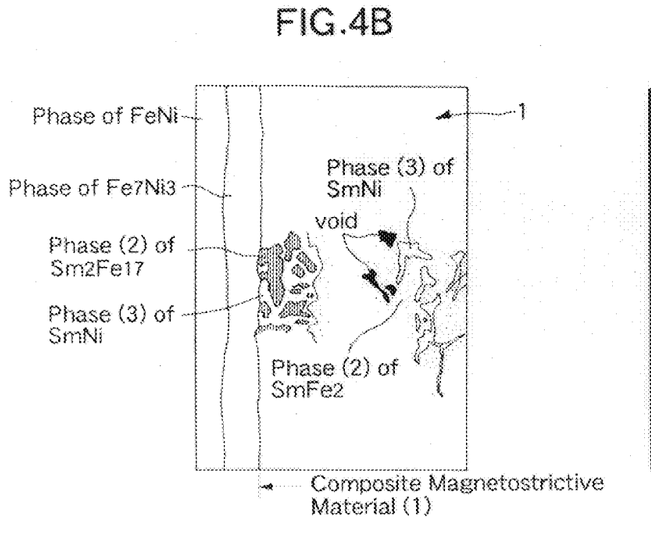
FIG. 4B is a tracing of an essential portion thereof shown in FIG. 4A.

FIG. 4A is a photomicrograph showing the metallographic structure of the composite magnetostrictive material 1, and FIG. 4B is a tracing of an essential portion thereof shown in FIG. 4A In FIGS. 4A and 4B, a gray phase of Fe$_7$Ni$_3$ and a black phase of FeNi are formed in a sequentially laminated manner on the surface of the composite magnetostrictive material 1. In the composite magnetostrictive material 1, a matrix 2 comprised of a light gray phase of SmFe$_2$ of the magnetostrictive material and dark gray phases of Sm$_2$Fe$_{17}$, and dispersion phases 3 of SmNi dispersed in the matrix are observed. In this case, the content "C" of Ni in the composite magnetostrictive material 1 was equal to 20% by volume.

Four more composite magnetostrictive materials 1 having different contents of Ni were produced using varied thermal treating times. Then, the magnetostriction amount and the compression strength of each of Examples 1 to 5 of the composite magnetostrictive materials 1 were measured. The magnetostriction amount was measured by applying a magnetic field at 1.5 kOe using a strain gauge. The compression strength was measured by a usual method. These measuring methods were likewise utilized for examples which will be described hereinafter.

Table 1 shows the thermal treating time, the content of Ni, the magnetostriction amount and the compression strength for the Examples 1 to 5. In Table 1, an Example 6 was produced by subjecting the magnetostrictive material 4 after casting to a thermal treatment in a vacuum at 800° C. for 6 hours in order to provide an enhanced magnetostrictive performance but without applying a diffusing material 5.

TABLE 1

Thermal treating temperature: 800° C.

| Examples A | Thermal Treating Time (hr) | Content of Ni (% by volume) | Magneto-striction amount (ppm) | Compression strength (kgf/mm$^2$) |
| --- | --- | --- | --- | --- |
| Example 1 | 9 | 25 | 320 | 39.0 |
| Example 2 | 6 | 20 | 590 | 38.6 |
| Example 3 | 5 | 15 | 640 | 37.0 |
| Example 4 | 4 | 10 | 760 | 35.6 |
| Example 5 | 2 | 5 | 830 | 31.9 |
| Example 6 | 6 | 0 | 1060 | 26.0 |

Figure 5:
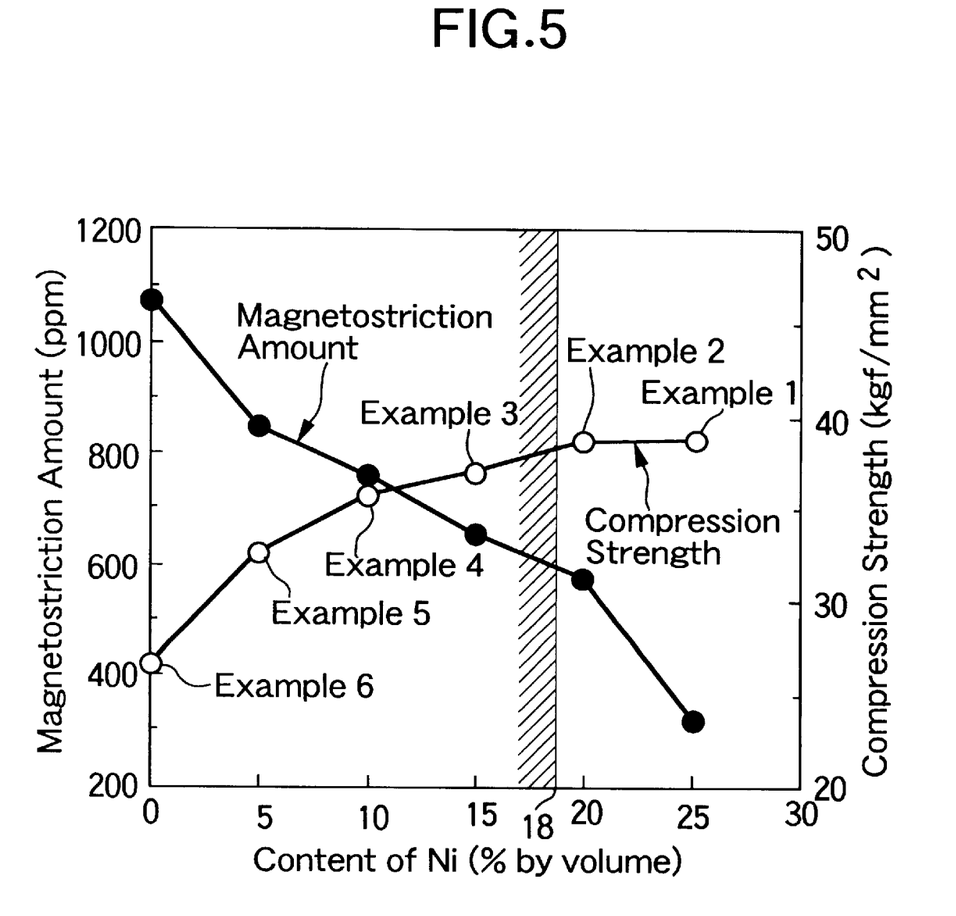
FIG. 5 is a graph illustrating the relationship among the content of Ni, the magnetostriction amount and the compression strength.

FIG. 5 is a graph illustrating the relationship among the content of Ni, the magnetostriction amount and the compression strength, as taken from Table 1. As is apparent from FIG. 5, in the composite magnetostrictive material, the strength is enhanced, but the magnetostriction amount is decreased, as the content of Ni is increased.

For a composite magnetostrictive material for a practical use, it is required that the composite magnetostrictive material has a magnetostriction amount of 600 ppm or more. From this point, the content C of Ni is set in a range of C≦18% by volume (wherein C>0% by volume).

EXAMPLES B

As shown in FIG. 2, plate-like diffusing materials 5 of Fe were brought into contact with opposite sides of a plate-like magnetostrictive material 4, respectively. These materials 4 and 5 were clamped by a pair of clamping members 6 made of iron and then subjected to a thermal treatment in a vacuum at 800° C. for 4 fours, thereby producing a composite magnetostrictive material 1, while at the same time, enhancing the magnetostrictive performance of the magnetostrictive material 4.

Figure 6A:
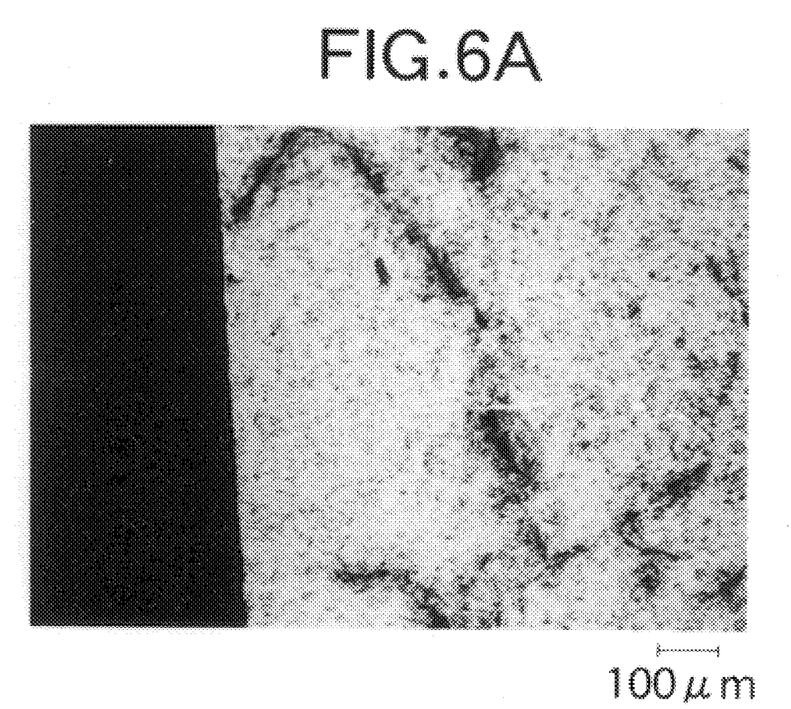
FIG. 6A is a photomicrograph showing the metallographic structure of a composite magnetostrictive material.
Figure 6B:
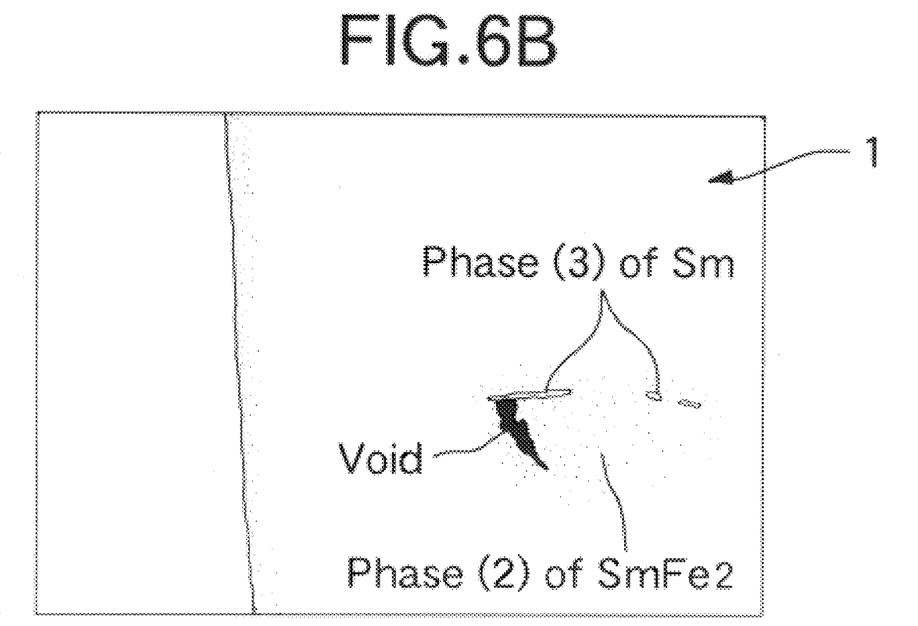
FIG. 6B is a tracing of an essential portion thereof shown in FIG. 6A.

FIG. 6A is a photomicrograph showing the metallographic structure of the composite magnetostrictive material 1, and FIG. 6B is a tracing of an essential portion thereof shown in FIG. 6A. FIGS. 6A and 6B a matrix 2 comprised of a gray phase of SmFe$_2$ and dispersion phases 3 of Sm dispersed in the matrix 2 are observed. In this case, the content C' of Sm in the composite magnetostrictive material 1 is equal to 5% by volume.

In the thermal treatment, a portion of the phase of Sm in the magnetostrictive material reacted with Fe to produce a phase of SmFe$_2$, and hence, the phase of Sm in FIG. 6 is an unreacted remaining phase of Sm.

Then, utilizing varied thermal treating times, four more composite magnetostrictive materials 1 having different contents of Sm were produced in the same manner. Then, the magnetostriction amount and the compression strength of each of Examples 1 to 5 of the composite magnetostrictive materials 1 were measured.

Table 2 shows the thermal treating time, the content of Sm, the magnetostriction amount and the compression strength for the examples 1 to 5. In Table 2, the Example 6 is the same as the Example 6 in Table 1.

TABLE 2

Thermal treating temperature: 800° C.

| Examples B | Thermal Treating Time (hr) | Content of Sm (% by volume) | Magnetostriction amount (ppm) | Compression strength (kgf/mm$^2$) |
|---|---|---|---|---|
| Example 1 | 0.5 | 25 | 295 | 38.5 |
| Example 2 | 1.0 | 20 | 510 | 36.3 |
| Example 3 | 1.5 | 15 | 600 | 34.6 |
| Example 4 | 2.0 | 10 | 720 | 29.4 |
| Example 5 | 4.0 | 5 | 820 | 30.0 |
| Example 6 | 6.0 | 0 | 1060 | 26.0 |

Figure 7:
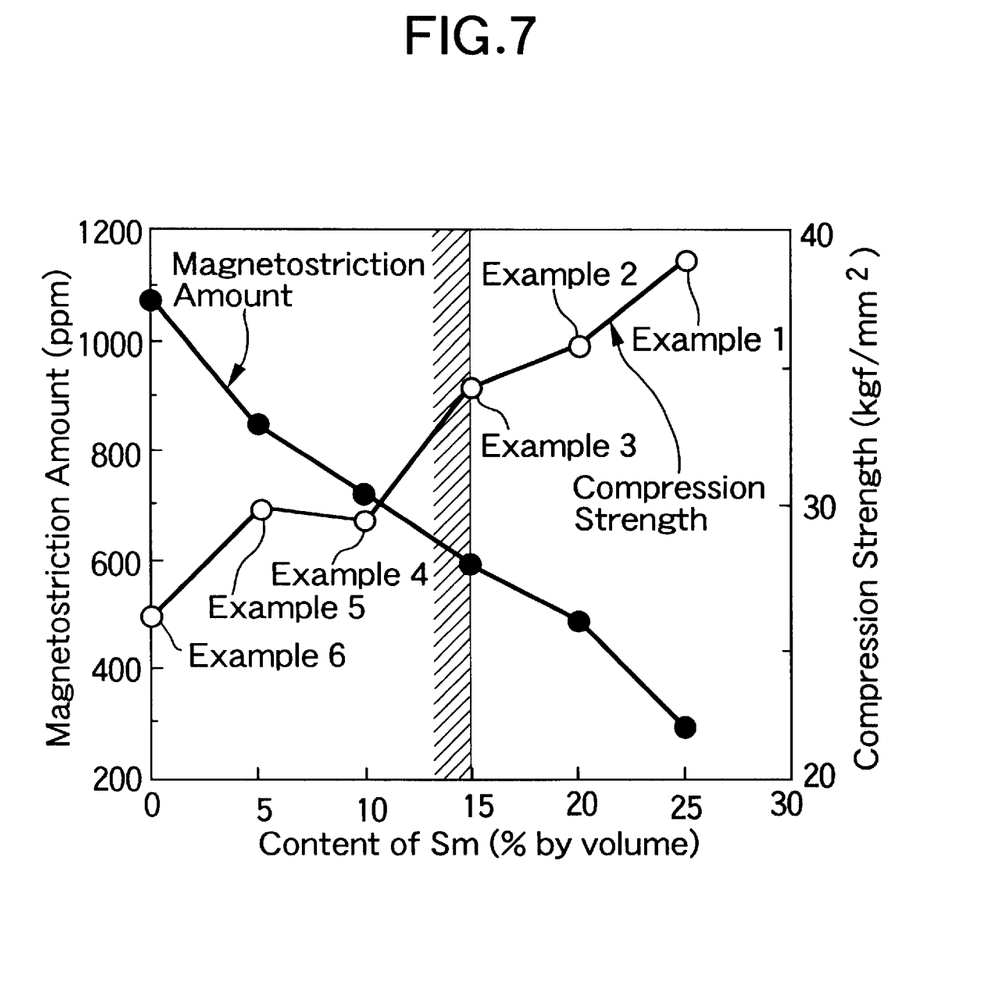
FIG. 7 is a graph illustrating the relationship among the content of Sm, the magnetostriction amount and the compression strength.

FIG. 7 is a graph illustrating the relationship among the content of Sm, the magnetostriction amount and the compression strength, as taken from Table 2. As is apparent from FIG. 7, in the composite magnetostrictive material 1, the strength is enhanced, but the magnetostriction amount is decreased, as the content of Sm is increased.

For a composite magnetostrictive material for a practical use, it is required that the composite magnetostrictive material has a magnetostriction amount of 600 ppm or more. From this point, the content C' of Sm is set in a range of C'≦15% by volume (wherein C'>0% by volume).

EXAMPLES C

A magnetostrictive material 4 of SmFe$_{1.5}$ alloy (the unit of a numerical value is the number of moles of the atom) was produced in the same process as described above. The magnetostrictive material 4 also had a metallographic structure similar to the magnetostrictive material as for Examples A above.

As shown in FIG. 2, plate-like diffusing materials 5 made of copper (Cu) were brought into contact with opposite sides of the plate-like magnetostrictive material 4, respectively. These materials 4 and 5 were clamped by a pair of clamping members 6 made of copper and then subjected to a thermal treatment in a vacuum at 800° C. for 6 hours to produce a composite magnetostrictive material 1, while at the same time, enhancing the magnetostrictive performance of the magnetostrictive material 4.

Figure 8A:
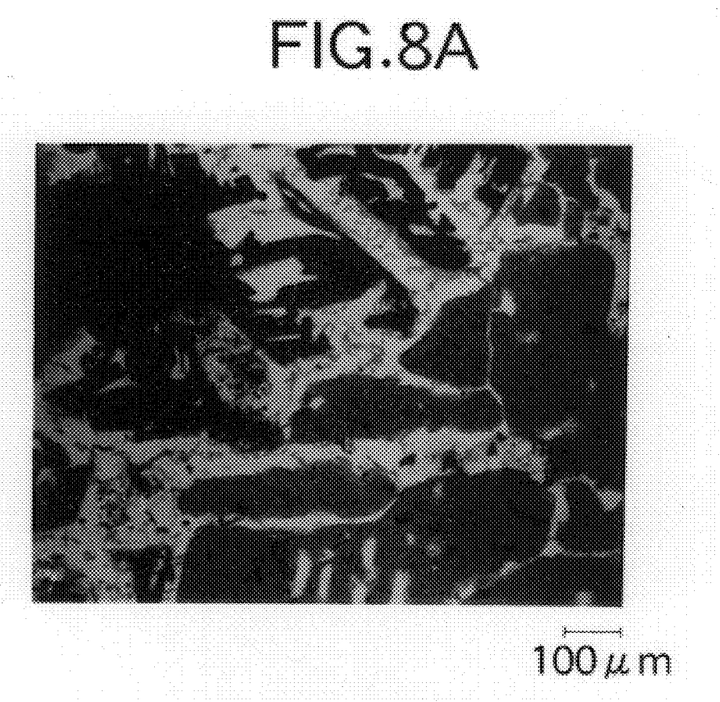
FIG. 8A is a photomicrograph showing the metallographic structure of a composite magnetostrictive material.
Figure 8B:
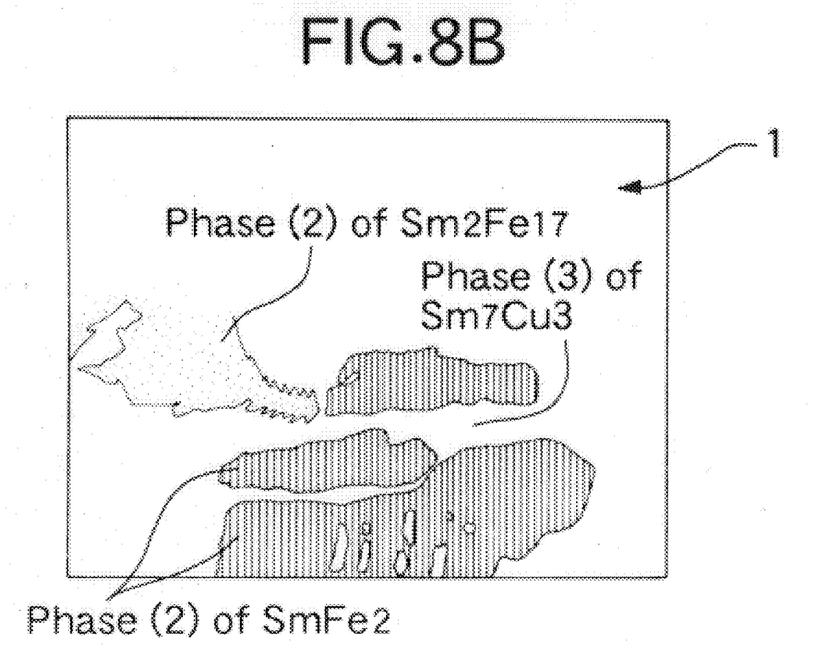
FIG. 8B is a tracing of an essential portion thereof shown in FIG. 8A.

FIG. 8A is a photomicrograph showing the metallographic structure of the composite magnetostrictive material 1, and FIG. 8B is a tracing of an essential portion thereof shown in FIG. 8A. In FIGS. 8A and 8B, a matrix 2 comprised of gray phases of SmFe$_2$ and a black phase of Sm$_2$Fe$_{17}$ and light gray dispersion phases 3 of Sm$_7$Cu$_3$ dispersed in the matrix are observed. In this case, the content C" of Cu in the composite magnetostrictive material 1 was equal to 20% by volume.

Figure 9A:
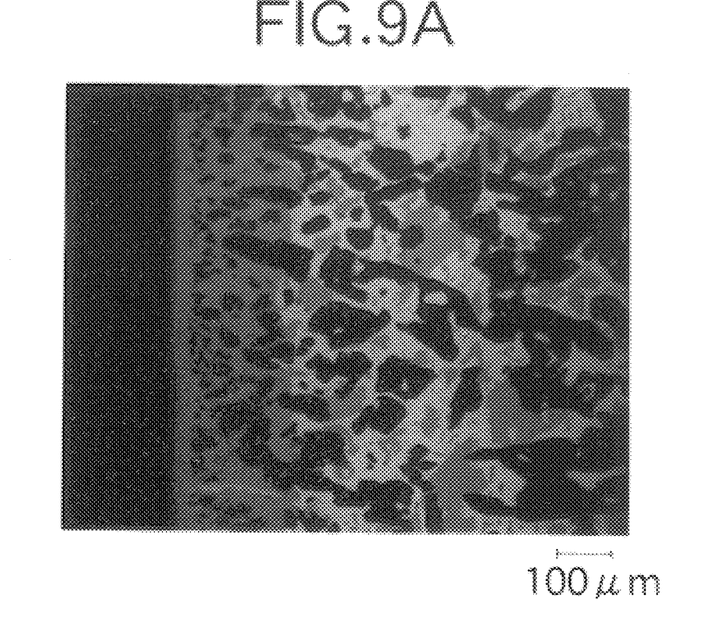
FIG. 9A is a photomicrograph showing the metallographic structure of a surface layer portion.
Figure 9B:
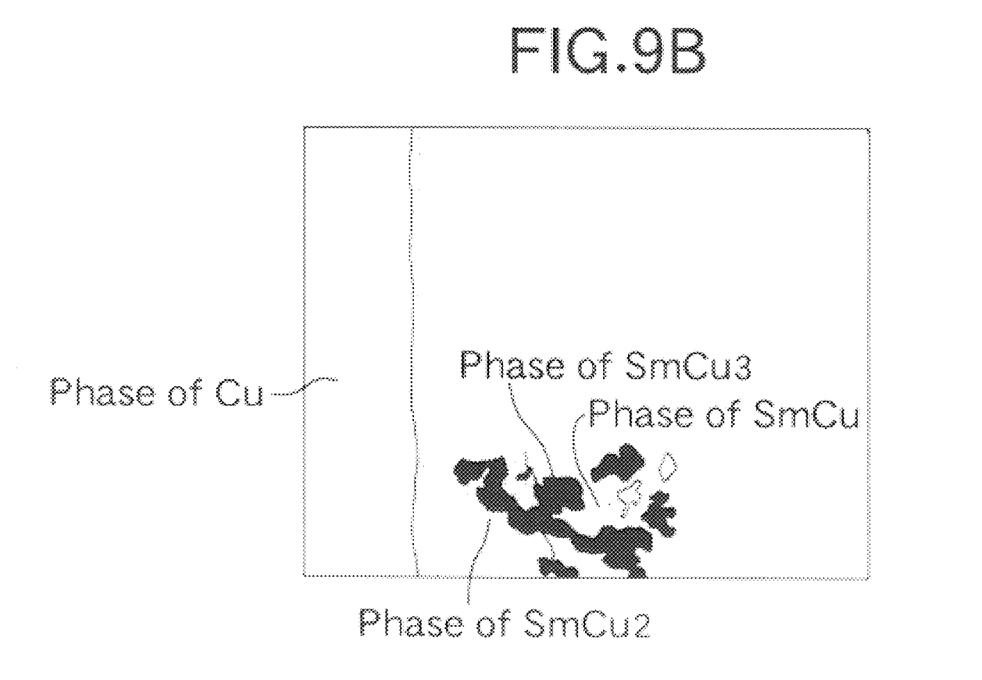
FIG. 9B is a tracing of an essential portion thereof shown in FIG. 9A.

FIG. 9A is a photomicrograph showing the metallographic structure of a surface layer portion in close contact with the surface of the composite magnetostrictive material 1, and FIG. 9B is a tracing of an essential portion thereof shown in FIG. 9A. In FIGS. 9A and 9B, an outermost phase of Cu, and a light gray phase of SmCu, a dark gray phase of SmCu$_2$ and a black phase of SmCu$_3$ located inside the phase of Cu are observed.

Then, using varied thermal treating times, four more composite magnetostrictive materials 1 having different contents of Cu were produced. Thereafter, the magnetostriction amount and the compression strength of each of Examples 1 to 5 of the composite magnetostrictive materials 1 were measured.

Table 3 shows the thermal treating time, the content of Cu, the magnetostriction amount and the compression strength for the Examples 1 to 5. In Table 3, the Example 6 is the same as the Example 6 in Table 1.

TABLE 3

Thermal treating temperature: 800° C.

| | Thermal Treating Time (hr) | Content of Cu (% by volume) | Magnetostriction amount (ppm) | Compression strength (kgf/mm$^2$) |
|---|---|---|---|---|
| Example 1 | 9 | 25 | 300 | 44.0 |
| Example 2 | 6 | 20 | 510 | 39.5 |
| Example 3 | 5 | 15 | 600 | 38.1 |
| Example 4 | 4 | 10 | 720 | 36.0 |
| Example 5 | 3 | 5 | 825 | 32.5 |
| Example 6 | 6 | 0 | 1060 | 26.0 |

Figure 10:
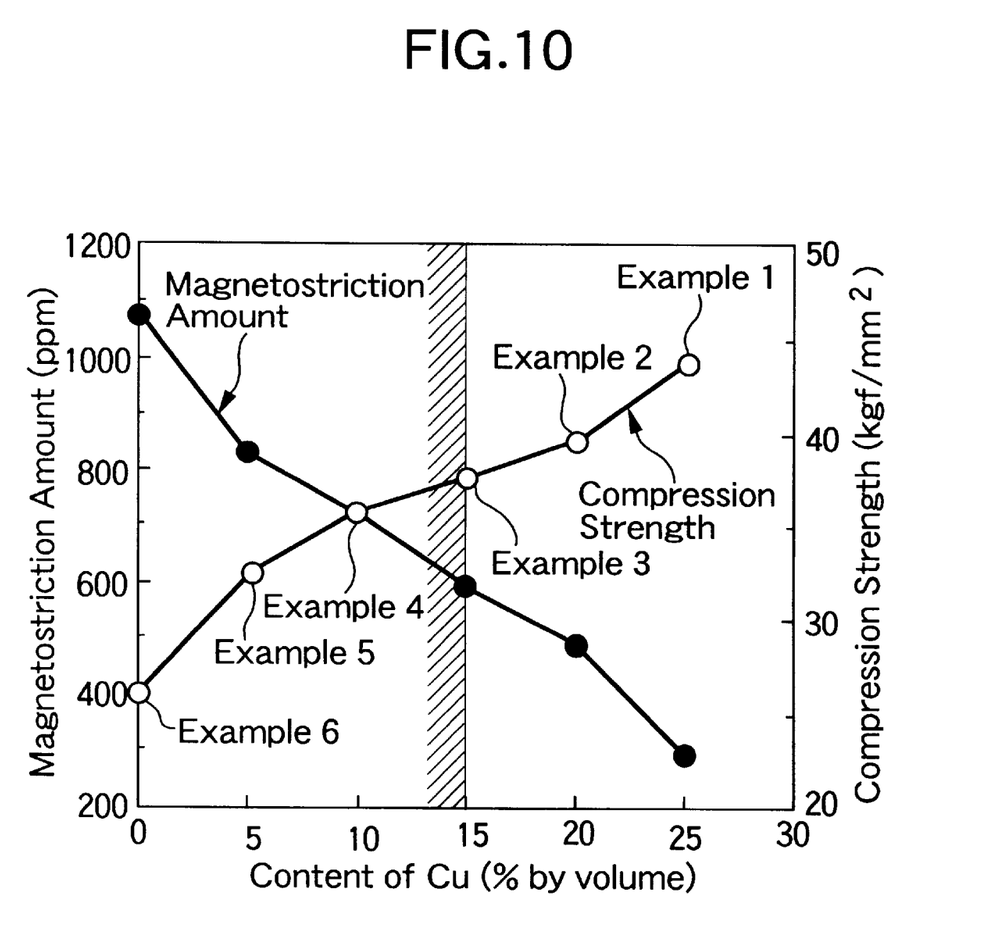
FIG. 10 is a graph illustrating the relationship among the content of Cu, the magnetostriction amount and the compression strength.

FIG. 10 is a graph illustrating the relationship among the content of Cu, the magnetostriction amount and the compression strength, as taken from Table 3. As is apparent from FIG. 10, in the composite magnetostrictive material 1, the strength is enhanced, but the magnetostriction amount is decreased, as the content of Cu is increased.

For a composite magnetostrictive material for a practical use, it is required that the composite magnetostrictive material has a magnetostriction amount of 600 ppm or more, as described above. From this point, the content C'" of Cu is set in a range of C'"≦15% by volume (wherein C'">0% by volume).

According to the present invention, it is possible to provide a composite magnetostrictive material having a magnetostrictive performance required for a practical use and yet a higher strength. In addition, according to the present invention, it is possible to provide a process for easily mass-producing a composite magnetostrictive material of the above-described type.

What is claimed:

1. A composite magnetostrictive material having a surface portion reinforced by bringing a diffusing material comprising a transition metal M excluding Fe into contact with a surface portion of a magnetostrictive material having a metallographic structure consisting essentially of SmFe$_2$, SmFe$_3$ and Sm phases, then subjecting said diffusing material and said magnetostrictive material to a thermal treatment, thereby producing dispersion phases consisting essentially of at least one intermetallic of Sm and M dispersed in said surface portion of said magnetostrictive material.

2. A composite magnetostrictive material according to claim 1, wherein the content of said dispersion phases with respect to said magnetostrictive material is less than or equal to 15% by volume.

3. A composite magnetostrictive material according to claim 2, wherein M is one of Ni and Cu.

4. A composite magnetostrictive material having a surface portion reinforced by bringing a diffusing material of Fe into contact with a surface portion of a magnetostrictive material having a metallographic structure consisting essentially of SmFe$_2$, SmFe$_3$ and Sm phases, then subjecting said diffusing material and said magnetostrictive material to a thermal treatment, thereby producing dispersion phases consisting of Sm dispersed in said surface portion of said magnetostrictive material in a matrix consisting essentially of one or more intermetallic phases consisting of Sm and Fe.

5. A composite magnetostrictive material according to claim 4, wherein the content of said Sm phases in said dispersion phases with respect to the magnetostrictive material is in a range of 0% by volume<Sm≦15% by volume.

6. A composite magnetostrictive material comprising:
a. a matrix of a magnetostrictive material selected from the group consisting of (1) a single phase magnetostrictive material consisting essentially of an $RM_2$ phase, and (2) a two phase magnetostrictive material consisting essentially of an $RM_2$ phase and a $R_2M_{17}$ phase, wherein R is a rare earth metal and M is selected from the group consisting of transition metals and aluminum; and
b. a dispersion phase dispersed in said matrix, said dispersion phase being selected from the group consisting of (1) R, and (2) an intermetallic consisting of R and T, wherein T is a transition metal that is different than M.

7. A composite magnetostrictive material according to claim 6, wherein the content of said dispersion phase in said magnetostrictive material is less than or equal to 15% by volume.

8. A composite magnetostrictive material according to claim 7, wherein T is selected from the group consisting of Cu and Ni.

9. A composite magnetostrictive material according to claim 8, wherein R is Sm.

10. A composite magnetostrictive material comprising:
a. a matrix of a magnetostrictive material selected from the group consisting of (1) a single phase magnetostrictive material consisting essentially of an $SmFe_2$ phase, and (2) a two phase magnetostrictive material consisting essentially of an $SmFe_2$ phase and a $Sm_2Fe_{17}$ phase; and
b. a dispersion phase dispersed in said matrix, said dispersion phase being selected from the group consisting of (1) Sm, and (2) an intermetallic consisting of Sm and T, wherein T is a transition metal other than Fe.

11. A composite magnetostrictive material according to claim 10, wherein the content of said dispersion phase in said magnetostrictive material is less than or equal to 15% by volume.

12. A composite magnetostrictive material according to claim 11, wherein T is selected from the group consisting of Cu and Ni.

* * * * *